United States Patent
Hueber et al.

(10) Patent No.: US 10,511,347 B2
(45) Date of Patent: Dec. 17, 2019

(54) DEVICE DETECTION IN CONTACTLESS COMMUNICATION SYSTEMS

(71) Applicant: NXP B.V., Eindhoven (NL)

(72) Inventors: Gernot Hueber, Linz (AT); Ian Thomas Macnamara, Graz (AT)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/812,200

(22) Filed: Nov. 14, 2017

(65) Prior Publication Data
US 2019/0149196 A1   May 16, 2019

(51) Int. Cl.
*H04B 5/00* (2006.01)
*G06K 7/10* (2006.01)

(52) U.S. Cl.
CPC ....... *H04B 5/0062* (2013.01); *G06K 7/10297* (2013.01); *G06K 7/10316* (2013.01); *H04B 5/0043* (2013.01)

(58) Field of Classification Search
CPC .. H04B 5/0062; H04B 5/0043; H04B 5/0081; H04B 5/0031; G06K 7/10297; G06K 7/10316; H03B 5/06
See application file for complete search history.

(56) References Cited

U.S. PATENT DOCUMENTS

| | | | | |
|---|---|---|---|---|
| 3,299,424 A | * | 1/1967 | Vinding | B61L 25/043 235/439 |
| 3,567,920 A | * | 3/1971 | Campbell | B61L 1/165 246/249 |
| 3,828,335 A | * | 8/1974 | Salmet | G01V 3/102 331/65 |
| 5,153,562 A | * | 10/1992 | van Breemen | G08B 13/242 340/10.2 |
| 8,471,642 B2 | * | 6/2013 | Hill | H03J 1/0008 327/553 |
| 8,934,837 B2 | * | 1/2015 | Zhu | H04B 5/02 340/568.1 |
| 8,977,197 B2 | * | 3/2015 | Krishnan | G06K 7/0008 455/41.1 |
| 8,983,417 B2 | * | 3/2015 | Koroglu | H03H 7/0169 455/232.1 |
| 9,515,750 B2 | * | 12/2016 | Mofidi | G06K 7/10336 |

(Continued)

FOREIGN PATENT DOCUMENTS

EP    2950415 A1    12/2015
JP    4945548 B2    6/2012

OTHER PUBLICATIONS

Leblebici D., et al. "Fundamentals of High-Frequency CMOS Analog Integrated Circuits", Cambridge University Press, 16 pgs. (2009).

(Continued)

*Primary Examiner* — Brian E Miller

(57) ABSTRACT

A near field communication (NFC) reader is disclosed. The NFC reader includes an antenna front-end that includes a low pass filter, a matching circuit and an antenna coil. The NFC reader also includes a NFC controller. The NFC controller includes an oscillator coupled to the antenna front-end and the NFC controller is configured to detect a presence of an object in proximity of the antenna front-end using one or more changes in an output of the oscillator. The antenna front-end creates a tank circuit for the oscillator.

15 Claims, 3 Drawing Sheets

(56) References Cited

U.S. PATENT DOCUMENTS

| | | | |
|---|---|---|---|
| 9,613,238 B2* | 4/2017 | Cho | G06K 7/10237 |
| 9,641,227 B2* | 5/2017 | Moon | H04B 5/02 |
| 10,110,183 B2* | 10/2018 | Lyalin | H03F 1/0288 |
| 2006/0199559 A1* | 9/2006 | Lin | H04B 1/0067 |
| | | | 455/280 |
| 2007/0126516 A1* | 6/2007 | Ahmed | H03F 1/02 |
| | | | 331/57 |
| 2010/0112941 A1* | 5/2010 | Bangs | H04B 5/0012 |
| | | | 455/41.1 |
| 2012/0071089 A1* | 3/2012 | Charrat | G06K 19/0723 |
| | | | 455/41.1 |
| 2012/0119808 A1* | 5/2012 | Motozawa | H04B 1/40 |
| | | | 327/270 |
| 2012/0249197 A1* | 10/2012 | Rehm | H02J 17/00 |
| | | | 327/156 |
| 2013/0040583 A1* | 2/2013 | Kim | H03L 7/0995 |
| | | | 455/84 |
| 2013/0178154 A1* | 7/2013 | Zhu | H04M 1/7253 |
| | | | 455/41.1 |
| 2013/0335199 A1* | 12/2013 | Jonely | G06K 7/10207 |
| | | | 340/10.5 |
| 2014/0028406 A1* | 1/2014 | Cao | H03B 5/1215 |
| | | | 331/117 FE |
| 2014/0049422 A1 | 2/2014 | Von Novak et al. | |
| 2014/0055344 A1 | 2/2014 | Seo et al. | |
| 2014/0106669 A1* | 4/2014 | Krishnan | H04B 5/00 |
| | | | 455/41.1 |
| 2014/0203879 A1 | 7/2014 | Kim et al. | |
| 2015/0094006 A1* | 4/2015 | Choi | H04B 5/0056 |
| | | | 455/232.1 |
| 2015/0286322 A1* | 10/2015 | Duteil | H04B 5/0062 |
| | | | 345/173 |
| 2015/0303997 A1* | 10/2015 | Dhayni | G06K 7/10128 |
| | | | 340/10.1 |
| 2016/0056762 A1* | 2/2016 | Ximenes | H03B 5/1265 |
| | | | 331/117 FE |
| 2016/0073222 A1* | 3/2016 | Lee | H04M 1/7253 |
| | | | 455/41.1 |
| 2016/0099681 A1* | 4/2016 | Zong | H03B 5/1215 |
| | | | 331/117 FE |
| 2016/0105188 A1* | 4/2016 | Cho | H03L 7/087 |
| | | | 375/374 |
| 2016/0105220 A1* | 4/2016 | Kim | H04B 5/0056 |
| | | | 455/41.1 |
| 2016/0203903 A1* | 7/2016 | Mattsson | H01F 17/0006 |
| | | | 331/117 R |
| 2016/0329638 A1* | 11/2016 | Kanno | G06K 7/10009 |
| 2016/0352373 A1* | 12/2016 | Wloczysiak | H04B 1/10 |
| 2018/0034505 A1* | 2/2018 | Dedieu | H03L 7/099 |

OTHER PUBLICATIONS

Darabi H., "Radio Frequency Integrated Circuits and Systems", Chapter 8 Oscillators, Cambridge University Press, 22 pgs. (2015).
Partial European Search Report for European Patent Appln. 18189005.4 (dated Feb. 27, 2019) (18 pgs).

* cited by examiner ered RF field. A matching circuitry is used to transform and adapt the antenna impedance to the emitting device's transmitter. A low ohmic matching impedance is generally used for increased power transmission.

DEVICE DETECTION IN CONTACTLESS COMMUNICATION SYSTEMS

BACKGROUND

Wireless communication technologies, such as those used for NFC or ISO/IEC 14443 devices, communicate with each other via magnetic field induction in close distance. Each device features an antenna. The primary device ("reader" or "initiator") generates the magnetic field which can be used to power secondary devices like passive transponders. Modulation schemes applied to the magnetic fields are used for communication purpose between the devices.

The primary device uses a transmitter to generate the emitted radio frequency (RF) field. A matching circuitry is used to transform and adapt the antenna impedance to the emitting device's transmitter. A low ohmic matching impedance is generally used for increased power transmission.

One limiting factor of the operating volume size is the emitted RF power of the primary device. Applications like contact-less payment systems require a specific operating distance. As the primary device's antenna size is often a constraint to the product, high output power transmitters are required.

The primary and secondary devices form a coupled wireless resonant circuit. If the coupling between the components is increased, the primary resonant circuit will be loaded and detuned. This results in a different load impedance seen by the primary device's transmitter, possibly causing an increased driver current and increased RF field emission.

Typically, the primary device use a periodic startup to check if any secondary device (e.g., a NFC card) is in the proximity. The checking may include measuring transmitter current, phase of the career wave, receiver voltage, etc. because these parameters are likely to be changed due to changes in antenna impedance when the secondary device is in the operational proximity. However, a full startup of the primary device frequently causes a higher energy usages. In addition, these methods do not offer high sensitivity, especially with modern small antennas.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a near field communication (NFC) reader is disclosed. The NFC reader includes an antenna front-end that includes a low pass filter, a matching circuit and an antenna coil. The NFC reader also includes a NFC controller. The NFC controller includes an oscillator coupled to the antenna front-end and the NFC controller is configured to detect a presence of an object in proximity of the antenna front-end using one or more changes in an output of the oscillator. The antenna front-end creates a tank circuit for the oscillator.

In some embodiments, the one or more changes in the output of the oscillator occur when the object causes detuning in the antenna front-end. The NFC reader also a transmitter and a receiver. The transmitter and the receiver are turned on only when the object is detected in the proximity of the antenna front-end. The NFC controller is configured to attempt to communicate with the object using the transmitter and the receiver to determine if the object is a NFC enabled device. The NFC controller further includes a peak detector to measure peak voltage of the output of the oscillator. The NFC controller further includes a frequency detector to measure output frequency of the oscillator. The NFC controller also includes an envelope detector to measure envelope of an output waveform of the oscillator.

In some other embodiments, the NFC controller is configured to detect the detuning using one or more of a peak detector, a frequency detector and an envelope detector coupled to the oscillator.

In some embodiments, the NFC controller includes Ant1 and Ant2 pins that are coupled to the antenna coil of the antenna front-end and the NFC controller is configured to measure a voltage difference at Ant1 and Ant2.

The NFC controller includes a control that causes the oscillator to start resonating using a startup pulse. The control determines a width of the startup pulse based on inductance of the antenna front-end at a time of starting the oscillator.

In some embodiments, the oscillator includes a current source and a transistor, wherein the oscillator is configured to use capacitance and inductance of the antenna front-end for the tank circuit. In some examples, instead of measuring changes in the oscillator output to detect the presence of an object in the proximity of the antenna front-end, the oscillator is started when the object is not in the proximity such that the oscillator is resonating at boundaries of stability based on capacitance and inductance of the tank circuit, wherein a change is the inductance of the antenna front-end due to a presence of the object in the proximity causes a detuning and the oscillator stops to resonate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in details in the description so as not to obfuscate the present disclosure.

Figure 1:
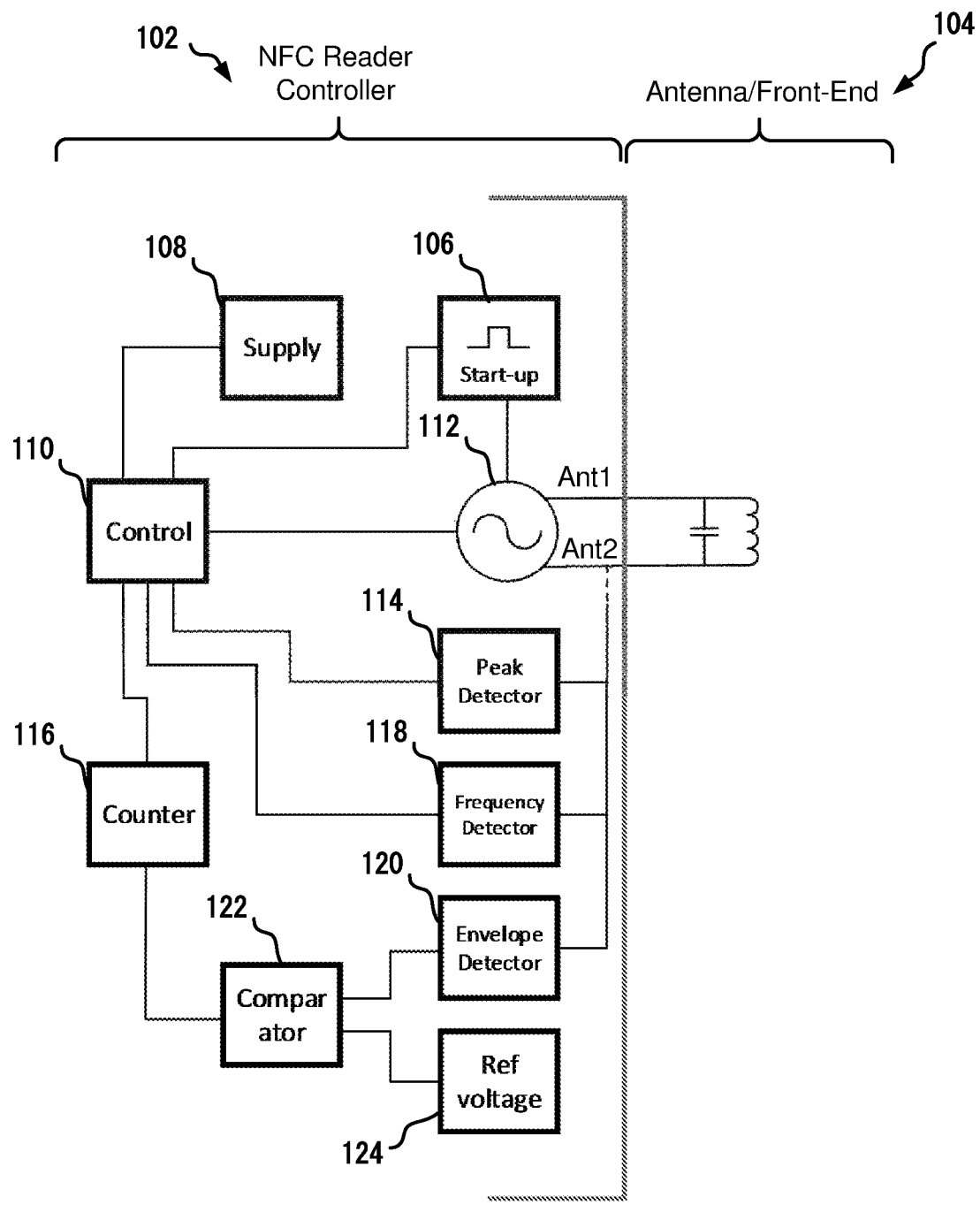
FIG. 1 depicts a schematic circuit diagram of a near field communication (NFC) controller with an antenna/front-end in accordance with one or more embodiments of the present disclosure.

FIG. 1 depicts a schematic circuit diagram of a near field communication (NFC) controller 102 with an antenna/front-end 104. The NFC controller 102 is typically an integrated circuit with ports to couple to external devices. As shown, the NFC controller 102 is coupled to an antenna/front-end 104. The antenna/front-end 104 may include a filter, a matching circuit and an antenna coil.

The NFC controller 102 may include an oscillator 112 and a startup module 106 to provide initial oscillations in the oscillator 112. The NFC controller 102 may also include a control 110 to control the process of detecting changes in oscillations. A peak detector 114 is included to measure peak voltages of the waveform produced by the oscillator 112. A frequency detector 118 is included to measure resonance frequency. An envelope detector 120 is included to measure an envelope voltage of the oscillator output. A reference voltage source 124 provides a reference to a comparator 122 that then compares the envelope voltage and increments/decrements a counter 116 if the envelope voltage is above or below the reference voltage. A power supply 108 is included to power the components of the NFC controller 102. To save power, the control 110 may turn the supply 108 on only when a contactless device is detected in the operational proximity of the NFC controller 102. The NFC controller 102 includes other components but they are being omitted in order not to obfuscate the present disclosure.

It should be noted that contrary to prior art methods in which a NFC reader is fully powered up periodically to detect a presence of a contactless device (such as a NFC card) in the operational proximity, the embodiments described herein do not require fully powering on the NFC controller 102 for the detection of a contactless device in the proximity. Instead, the NFC controller 102 is configured to keep components other than shown in FIG. 1 in non-powered state until a contactless device is detected in the operational proximity of the NFC controller 102. The prior art methods use transmitter and receiver circuits periodically for the detection of a secondary device that using the transmitter and receiver circuits consumes more power than the embodiments described herein because these embodiments do not use the transmitter and receiver for the detection of the secondary device in the proximity.

The control 110 triggers the resonance in the oscillator 112 through the startup module 106 that may provide a trigger pulse to put the oscillator 112 in resonance mode. In some embodiments, instead of using a trigger pulse, the startup module 106 may provide RLC to push the oscillator 112 into resonance mode.

In some cases, the secondary device may already be in the operational proximity of the NFC controller 102. In such cases, the startup behavior of the oscillator 112 may be different from the case in which there is no secondary device in the proximity because if the secondary device is in the proximity, the antenna/front-end 104 would be detuned. The control 110 may detect changed inductance, for example, when the secondary device is in the proximity and cause the startup module 106 to use low energy startup pulse. In another example, how fast the oscillation amplitude rise to a stable value may change if the antenna is detuned due to the secondary device being in the proximity.

It should be noted that one or more components shown in FIG. 1, such as the peak detector 114, the frequency detector 118 and the envelope detector 120 may be omitted depending upon a particular method to be used for the detection of the secondary device in the proximity. For example, in one embodiment, the secondary device may be detected by monitoring changes in resonance frequency only, hence in such embodiment, the peak detector 114 and/or the envelope detector 120 may not be needed. In some embodiments, first the peak detector 114 is used to detect the antenna detuning and if the detuning is detected either the frequency detector 118 or the envelope detector 120 may be used to confirm the results obtained through the use of the peak detector 114. In another embodiment, first the frequency detector 118 is used and then either the peak detector 114 or the envelope detector 120 is used to confirm the results obtained through the use of the frequency detector 118. In yet another embodiment, first the envelope detector 120 is used to detect the antenna detuning and then either the frequency detector 118 or the peak detector 114 is used to confirm the results. In some embodiments, all three methods may be used in sequence.

Figure 2:
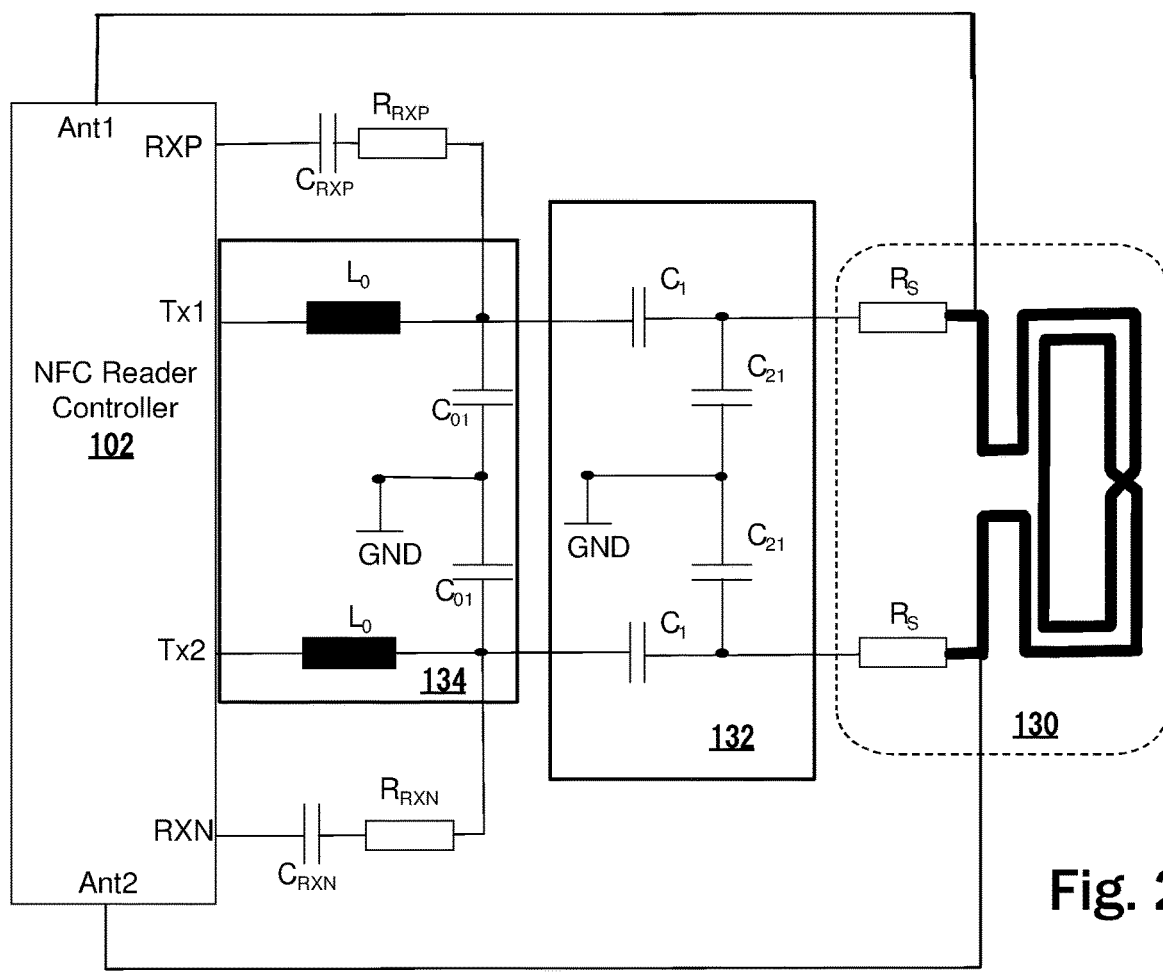
FIG. 2 depicts a schematic circuit diagram of a NFC controller and an antenna/front-end in accordance with one or more embodiments of the present disclosure.

FIG. 2 depicts a schematic circuit diagram of the NFC controller 102 and the antenna/front-end 104 that may include an antenna 130, a matching circuit 132 and an electromagnetic compatibility (EMC) low pass filter 134. The NFC controller 102 may have balanced receiver ports RXP and RXN and balanced transmitter ports Tx1 and Tx2. The NFC controller 102 may also include antenna ports Ant1 and Ant2 to couple the antenna 130 to the NFC controller 102. The EMC filter 134 may include a pair of inductors $L_0$ and a pair of capacitors $C_{01}$. The EMC filter 134 may be coupled to the NFC controller 102 via Tx1, Tx2 and to the RXP port through $C_{RXP}$ and $R_{RXP}$ and to the RXN port through $C_{RXN}$ and $R_{RXN}$. The matching circuit 132 may include capacitors $C_1$ and $C_{21}$. It should be noted that the EMC filter 134 and the matching circuit 132 may be implemented using other combinations of R, C and L. The antenna 130 may include an antenna coil and a pair of resistors Rs. The antenna coil may be coupled to the NFC controller 102 at the ports Ant1 and Ant2.

Figure 3:
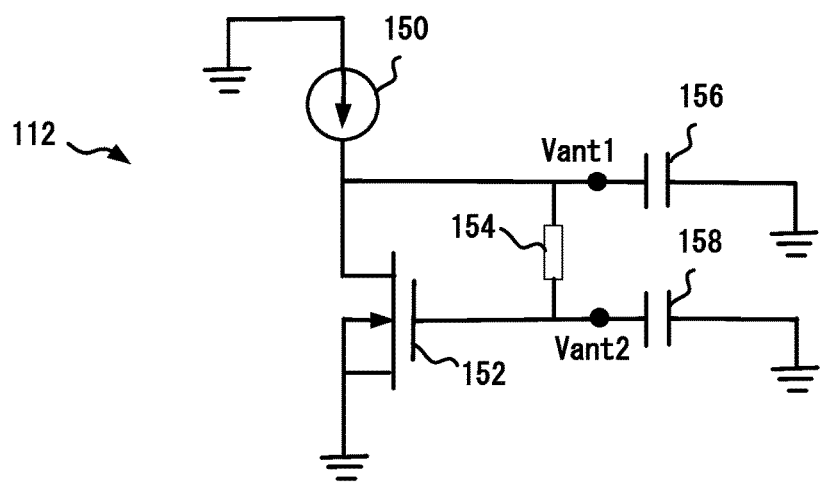
FIG. 3 shows an oscillator coupled to an antenna in accordance with one or more embodiments of the present disclosure.

FIG. 3 shows a simplified representation of a circuit related to the oscillator 112 of FIG. 1. The oscillator 112 includes a current source 150. As shown in FIG. 1, oscillator 112 is coupled to the antenna 130. An inductor 154 represents the inductance of the front-end 104 and capacitors 156 and 158 represent the capacitance of the front-end 104. A transistor 152 is included to provide oscillations.

In one or more embodiments, when the oscillator 112 is in the resonance mode and when a secondary device is brought in the operational proximity to the front-end 104, the impedance 154 may change and this change may be detected using the peak detector 114 because the peak voltage of the resonating wave may change. The control 110 may include reference data to be compared with the peak voltage and based on the comparison, the control 110 may determine that the secondary device is in the operational proximity. In this embodiment, the frequency detector 118 and the envelope detector 120, the ref voltage source 124, the comparator 122 and the counter 116 may not be needed. In other words, the presence of the secondary device may be detected using one or more of the peak detector, the frequency detector 118 and the envelope detector 120.

Similarly, when the inductance 154 changes, the resonance frequency may also change because the resonance frequency depends on the value of the antenna inductance. A change in the frequency may be measured and the control 110 may make a determination that a secondary device is in the operational proximity.

Still similarly, the envelope of the resonating waveform may change due to changes in the inductance 154 and if the envelope voltage stays in a predetermined range, the control 110 may make a determination that a secondary device is present in the operational proximity. The counter 116 determines the time period for which the amplitude of the waveform stays above the reference voltage. In some embodiments, the oscillator 112 is tuned close to the limit of oscillation, for example, by tuning the transistor gain and the current source.

It should be noted that the inductance 154 may also be changed if an object (e.g., a metal object or human body) is brought in the proximity of the front-end 104. Hence, in some embodiments, after the control 110 makes a determination that an object is in the operational proximity, the NFC controller 102 turns on the transmitter and the receiver and makes an attempt to communicate with the secondary device to confirm that the object that is really a contactless NFC device (e.g., a NFC card or tag). If the object is not the secondary device, the communication with the object will fail. If the communication fails, the control 110 turns off the transmitter and the receiver.

Figure 4:
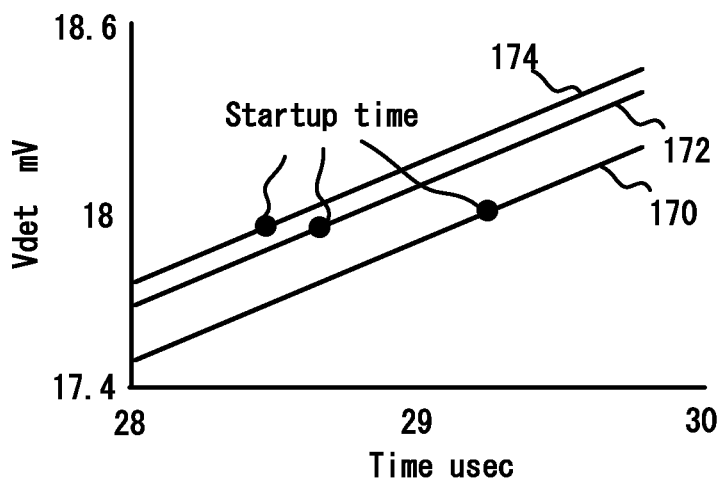
FIG. 4 displays a graph of envelop voltage at different coupling factors in accordance with one or more embodiments of the present disclosure.

FIG. 4 displays a simulation graph of envelop voltage at different coupling factors and shows the envelope of the oscillation amplitude. The envelope amplitude is compared to a reference threshold and the time for initial startup of the oscillator 112 to the time when the amplitude exceeding the threshold is captured. The curve (which may not a straight line in practice) 174 represents a simulation when the antenna coupling factor k=0, the startup time is 28.44 usec which may be considered the reference. In the curve 172, k is 0.5%, the startup time is increased by 0.2 us and for the curve 170, k is 1% and the startup time is increased by 0.73 usec. In some embodiment, these time differences can be measured using a system clock of approximately 45 MHz. In some examples, multiple readings are obtained and the averaging technique may be used. In the simulation of FIG. 4, the sensitivity for detecting a secondary device at k=1% is −32 dB and the current is 0.5 mA.

In some examples, the oscillator 112 is tuned by selecting the values of impedance such it is at the boundary of its oscillation stability. That means if the value of impedance changes on either higher or lower sides, the oscillator 112 stops oscillating. In this example, when a secondary device is brought in the operational proximity of the front-end 104, the impedance changes and the oscillator 112 enters in non-resonating mode. The control 110 can determine that an object is in the operational proximity when the oscillations stop.

In some examples, the oscillator 112 may be started using the sweep of the bias voltage. For the sweep of the value of the bias voltage at which oscillation starts is captured that in turn translate to a detuning condition. As this example uses the oscillator 112 at the boundary of its stability, it can be considered highly sensitive to any detuning affecting the resonance tank circuit. Similarly, the length of start up pulse may be used to tune the oscillator 112 to oscillate at the boundary of its stability.

Figure 5:
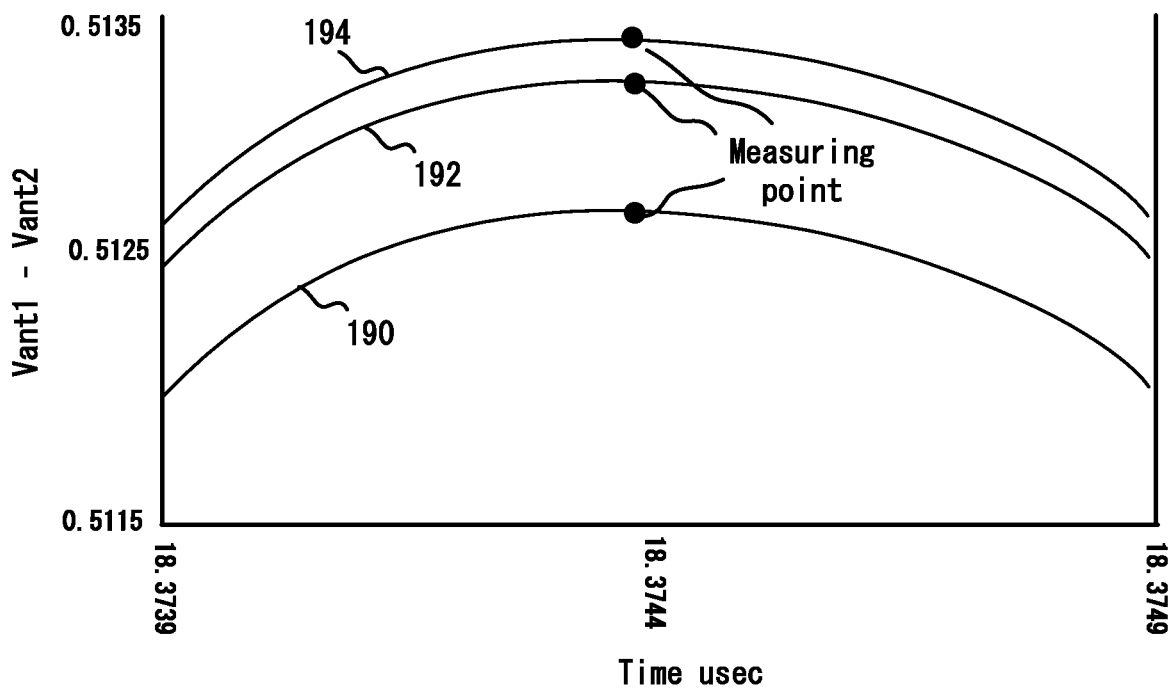
FIG. 5 depicts a graph of voltage difference at antenna ports at different coupling factors in accordance with one or more embodiments of the present disclosure.

FIG. 5 depicts a graph of voltage difference at antenna ports at different coupling factors. In one example, the detuning of the front-end 104 may be captured by measuring oscillation amplitude. In this example, the peak oscillation voltage is measured at a specific time after oscillator starts and the measured value is compared with a reference value. In some examples, the reference value may be a previous measurement of the peak oscillation voltage. In the simulation depicted in FIG. 5, the oscillation for k=0 (the curve 194) shows a peak differential amplitude of 513.2 mV. For k=0.5% (the curve 192) the peak differential amplitude degrades to 0.16 mV and for k=1% (the curve 190) the peak differential amplitude reduces by 0.6 mV. In this simulation, the sensitivity for detecting a secondary device is −58 dB which is better than the Tx voltage and Rx current methods used by prior arts.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. A near field communication (NFC) reader, comprising:
    an antenna front-end that includes a low pass filter, a matching circuit, and an antenna coil, the antenna front-end having a capacitance and an inductance; and
    an NFC controller, wherein the NFC controller includes an oscillator, configured to operate at a boundary of its stability and use the capacitance and the inductance of the antenna front-end as a tank circuit such that the oscillator is resonating at the boundary of its stability based on the capacitance and the inductance of the tank circuit, and coupled to the antenna front-end, and the NFC controller is configured to detect a presence of an object in proximity of the antenna front-end using one or more changes in an output of the oscillator.

2. The NFC reader of claim 1, wherein the one or more changes in the output of the oscillator occur when the presence of the object detunes the antenna front-end.

3. The NFC reader of claim 1, further including:
    a transmitter and a receiver.

4. The NFC reader of claim 3, wherein the transmitter and the receiver are configured to be turned on only when the object is detected in the proximity of the antenna front-end.

5. The NFC reader of claim 4, wherein the NFC controller is configured to attempt to communicate with the object using the transmitter and the receiver to determine whether the object is an NFC enabled device.

6. The NFC reader of claim 1, wherein the NFC controller further comprises:
    a peak detector configured to measure a peak voltage of the output of the oscillator.

7. The NFC reader of claim 1, wherein the NFC controller further comprises:
    a frequency detector configured to measure output frequency of the oscillator.

8. The NFC reader of claim 1, wherein the NFC controller further comprises:
    an envelope detector configured to measure an envelope of an output waveform of the oscillator.

9. The NFC reader of claim 1, wherein the NFC controller is configured to detect detuning using one or more of a peak detector, a frequency detector, and an envelope detector coupled to the oscillator.

10. The NFC reader of claim 1, wherein the NFC controller includes Ant1 and Ant2 pins that are configured to be coupled to the antenna coil of the antenna front-end.

11. The NFC reader of claim 10, wherein the NFC controller is configured to measure a voltage difference at the Ant1 and Ant2 pins.

12. The NFC reader of claim 1, wherein the NFC controller includes a control that is configured to cause the oscillator to start resonating using a startup pulse.

13. The NFC reader of claim 1, wherein the oscillator includes a current source and a transistor, and the oscillator is configured to use the capacitance and the inductance of the antenna front-end for the tank circuit.

14. A near field communication (NFC) reader, comprising:
    an antenna front-end that includes a low pass filter, a matching circuit, and an antenna coil, the antenna front-end having a capacitance and an inductance; and
    an NFC controller, wherein the NFC controller includes an oscillator coupled to the antenna front-end and configured to use the capacitance and the inductance of the antenna front-end as a tank circuit such that the oscillator is resonating at a boundary of its stability based on the capacitance and the inductance of the tank circuit, and the NFC controller is configured to detect a presence of an object in proximity of the antenna front-end using one or more changes in an output of the oscillator, and the NFC controller is configured to determine a width of a startup pulse based on an inductance of the antenna front-end at a time of starting the oscillator.

15. A near field communication (NFC) reader, comprising:
    an antenna front-end that includes a low pass filter, a matching circuit, and an antenna coil, the antenna front-end having a capacitance and an inductance; and
    an NFC controller, wherein the NFC controller includes an oscillator coupled to the antenna front-end and configured to use the capacitance and the inductance of the antenna front-end as a tank circuit such that the oscillator is resonating at the boundary of its stability based on the capacitance and the inductance of the tank circuit, and the NFC controller is configured to detect a presence of an object in proximity of the antenna front-end using one or more changes in an output of the oscillator, the oscillator is started when the object is not in the proximity of the antenna front-end and a change in inductance of the antenna front-end due to a presence of the object in the proximity detunes the antenna front-end, and the oscillator stops resonating.

* * * * *